(12) United States Patent
Abbott

(10) Patent No.: US 7,788,800 B2
(45) Date of Patent: Sep. 7, 2010

(54) METHOD FOR FABRICATING A LEADFRAME

(75) Inventor: Donald C Abbott, Norton, MA (US)

(73) Assignee: Texas Instruments Incorporated, Dallas, TX (US)

( * ) Notice: Subject to any disclaimer, the term of this patent is extended or adjusted under 35 U.S.C. 154(b) by 490 days.

(21) Appl. No.: 11/936,161

(22) Filed: Nov. 7, 2007

(65) Prior Publication Data

US 2008/0098594 A1    May 1, 2008

Related U.S. Application Data

(62) Division of application No. 11/273,467, filed on Nov. 14, 2005, now Pat. No. 7,309,909.

(60) Provisional application No. 60/719,144, filed on Sep. 21, 2005.

(51) Int. Cl.
*H01R 43/00* (2006.01)

(52) U.S. Cl. ............... 29/827; 29/885; 427/125; 257/677

(58) Field of Classification Search ......... 29/827, 29/874, 885; 72/47; 257/666, 676, 677, 257/692, 736, 748, 750; 361/813; 427/125; 428/675; 438/123; 439/886

See application file for complete search history.

(56) References Cited

U.S. PATENT DOCUMENTS

| | | | |
|---|---|---|---|
| 5,360,991 A | 11/1994 | Abys et al. | |
| 5,510,197 A | 4/1996 | Takahashi et al. | |
| 5,801,436 A | 9/1998 | Serizawa | |
| 5,914,532 A * | 6/1999 | Akagi et al. | 361/813 |
| 5,994,767 A | 11/1999 | Huang et al. | |
| 6,245,448 B1 * | 6/2001 | Abbott | 257/677 |
| 7,174,626 B2 * | 2/2007 | Kwoka et al. | 29/827 |
| 7,309,909 B2 * | 12/2007 | Abbott | 257/666 |
| 7,413,934 B2 * | 8/2008 | Tellkamp | 257/666 |

OTHER PUBLICATIONS

Tellkamp, John P., U.S. Appl. No. 11/009,290 entitled "Method for the Thermal Testing of a Thermal Path to an Integrated Circuit,", filed Dec. 10, 2004.

* cited by examiner

*Primary Examiner*—Donghai D. Nguyen
(74) *Attorney, Agent, or Firm*—Yingsheng Tung; Wade J. Brady, III; Frederick J. Telecky, Jr.

(57) ABSTRACT

A semiconductor device has a leadframe with a structure made of a base metal (105), wherein the structure consists of a chip mount pad (402) and a plurality of lead segments (403). Covering the base metal are, consecutively, a nickel layer (301) on the base metal, and a continuous layer of noble metal, which consists of a gold layer (201) on the nickel layer, and an outermost palladium layer (202) on the gold layer. A semiconductor chip (410) is attached to the chip mount pad and conductive connections (412) span from the chip to the lead segments. Polymeric encapsulation compound (420) covers the chip, the connections, and portions of the lead segments. In QFN devices with straight sides (501), the compound forms a surface (421) coplanar with the outermost palladium layer (202) on the un-encapsulated leadframe surfaces.

9 Claims, 2 Drawing Sheets

METHOD FOR FABRICATING A LEADFRAME

This application is a division of application Ser. No. 11/273,467 filed Nov. 14, 2005, Issued as U.S. Pat. No. 7,309,909 which claims priority of provisional application Ser. No. 60/719,144 filed Sep. 21, 2005. The contents of the parent application are herein incorporated by reference in its entirety.

FIELD OF THE INVENTION

The present invention is related in general to the field of semiconductor devices and processes, and more specifically to the materials and fabrication of leadframe finishes for integrated circuit devices and semiconductor components.

DESCRIPTION OF THE RELATED ART

Leadframes for semiconductor devices provide a stable support pad for firmly positioning the semiconductor chip, usually an integrated circuit (IC) chip, within a package. It has been common practice to manufacture single piece leadframes from thin (about 120 to 250 μm) sheets of metal. For reasons of easy manufacturing, the commonly selected starting metals are copper, copper alloys, iron-nickel alloys (for instance the so-called "Alloy 42"), and aluminum. The desired shape of the leadframe is stamped or etched from the original sheet.

In addition to the chip pad, the leadframe offers a plurality of conductive segments to bring various electrical conductors into close proximity of the chip. The remaining gaps between the inner end of the segments and the contact pads on the IC surface are bridged by connectors, typically thin metal wires such as gold individually bonded to the IC contact pads and the leadframe segments. Consequently, the surface of the inner segment ends has to be metallurgically suitable for stitch-attaching the connectors.

The end of the lead segments remote from the IC chip ("outer" ends) need to be electrically and mechanically connected to external circuitry such as printed circuit boards. This attachment is customarily performed by soldering, conventionally with a tin alloy solder at a reflow temperature above 200° C. Consequently, the surface of the outer segment ends needs to have a metallurgical configuration suitable for reflow attachment to external parts.

Finally, the leadframe provides the framework for encapsulating the sensitive chip and fragile connecting wires. Encapsulation using plastic materials, rather than metal cans or ceramic, has been the preferred method due to low cost. The transfer molding process for epoxy-based thermoset compounds at 175° C. has been practiced for many years. The temperature of 175° C. for molding and mold curing (polymerization) is compatible with the temperature of >200° C. for eutectic solder reflow.

Reliability tests in moist environments require that the molding compounds have good adhesion to the leadframe and the device parts it encapsulates. Two major contributors to good adhesion are the chemical affinity between the molding compound and the metal finish of the leadframe, and the surface roughness of the leadframe.

In recent years, a number of technical trends have made it more and more complicated to find a satisfactory solution for the diverse requirements. As an example, the package dimensions are shrinking, offering less surface for adhesion. Then, the requirement to use lead-free solders pushes the reflow temperature range into the neighborhood of about 260° C., making it more difficult to maintain mold compound adhesion to the leadframes. This is especially true for the very small leadframe surface available in QFN (Quad Flat No-lead) and SON (Small Outline No-lead) devices.

SUMMARY OF THE INVENTION

Applicant recognizes the need for a fresh concept of achieving low-cost device fabrication using leadframe structures tailor-made for high reliability of semiconductor devices. The low-cost leadframes are to offer a combination of adhesion to molding compounds, bondability for connecting wires, solderablity of the exposed leadframe segments, and no risk of tin dendrite growth.

There are technical advantages, when the leadframe and its method of fabrication are flexible enough to be applied for different semiconductor product families and a wide spectrum of design and assembly variations, and achieve improvements toward the goals of improved process yields and device reliability. There are further technical advantages, when these innovations are accomplished using the installed equipment base so that no investment in new manufacturing machines is needed.

One embodiment of the invention is a leadframe strip with a structure made of a base metal, wherein the structure has a plurality of surfaces. On the base metal surfaces is a layer of noble metal, which includes a layer of gold followed by an outermost layer of palladium in contact with the gold layer. Furthermore, there may be a nickel layer between the base metal surfaces and the noble metal layer so that the nickel layer is in contact with the base metal surfaces and with the gold layer.

In terms of preferred thicknesses, the gold layer is between about 2 and 5 nm, preferably about 3 nm thick, the palladium layer between about 5 and 15 nm, preferably about 10 nm thick, and the nickel layer between about 0.5 and 2.0 μm thick. The thinness of the precious metal layers and the preferred process of electrolytic plating provide low cost leadframes. Palladium offers excellent adhesion to molding compounds, and, together with the underlying gold, excellent bondability and solderability.

Another embodiment of the invention is a semiconductor device, which has a leadframe with a structure made of a base metal, wherein the structure includes a chip mount pad and a plurality of lead segments. Covering the base metal is noble metal layer, which consists of a gold layer in contact with the base metal and an outermost palladium layer in contact with the gold layer. Alternatively, a nickel layer may be between the base metal and the noble metal layer so that the nickel layer is in contact with the base metal and with the gold layer. A semiconductor chip is attached to the chip mount pad, and conductive connections span from the chip to the lead segments. Polymeric encapsulation material covers the chip, the connections and portions of the lead segments.

Another embodiment of the invention is a method for fabricating a leadframe. A base metal structure with a plurality of surfaces is provided. A stack of metal layers adherent to the base metal is plated on each of the surfaces. While electrolytical plating is the preferred method, electroless plating is an alternative. These plating steps consist consecutively of plating a gold layer, preferably about 3 nm thick, to cover substantially the base metal, and plating a palladium layer, preferably about 10 nm thick, to cover substantially the gold layer. A nickel layer, between about 0.5 and 2.0 μm thick, may be plated between the base metal and the gold layer. All plating steps can be performed without masking or selective plating and are thus low cost.

It belongs to the technical advantages of the invention that no toxic or whiskering materials are used for the plating steps, down-bonding capability is enhanced, adhesion to molding compounds is enhanced, and moisture-level device quality is improved. Furthermore, the required plating processes are inexpensive and easy to manufacture.

The technical advances represented by certain embodiments of the invention will become apparent from the following description of the preferred embodiments of the invention, when considered in conjunction with the accompanying drawings and the novel features set forth in the appended claims.

DETAILED DESCRIPTION OF THE PREFERRED EMBODIMENTS

Figure 1:
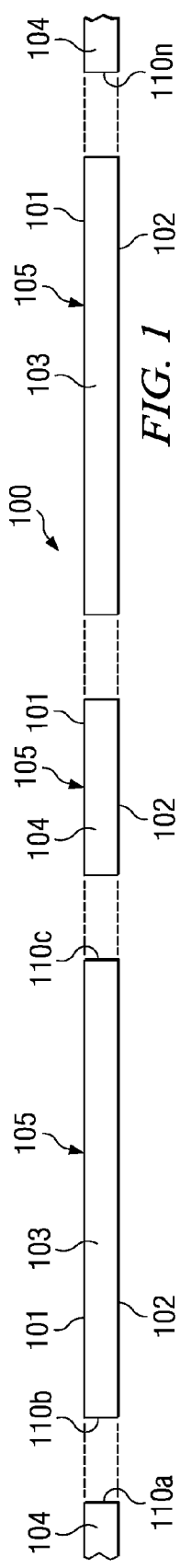
FIG. 1 is a schematic cross section of the base metal structure of a portion of a leadframe strip with formed leadframe structures.

FIG. 1 illustrates a schematic cross section of a leadframe portion generally designated 100, which is intended to be used on the fabrication of a semiconductor device. The leadframe has a structure made from a sheet of metal, wherein the structure has a plurality of surfaces: the first surface 101, the second surface 102, and numerous side edge surfaces 110a, 110b . . . 110n. While the surfaces 101 and 102 originate from the surfaces of the sheet of starting material, the side edge surfaces 110a to 110n have been created by the forming process of the leadframe structure. In the example of FIG. 1, the leadframe portion depicted contains a plurality of portions 103, which are intended to become chip mount pads, and a plurality of portions 104, which are intended to become the lead segments of the device-to-be-built. The leadframe is made of a base metal 105.

As defined herein, the starting material of the leadframe is called the "base metal", indicating the type of metal. Consequently, the term "base metal" is not to be construed in an electrochemical sense (as in opposition to 'noble metal') or in a structural sense.

Base metal 105 is typically copper or a copper alloy. Other choices comprise brass, aluminum, iron-nickel alloys ("Alloy 42"), and Kovar.

Base metal 105 originates with a metal sheet in the preferred thickness range from 100 to 300 µm; thinner sheets are possible. The ductility in this thickness range provides the 5 to 15% elongation that facilitates the segment bending and forming operation needed for some of the finished devices (for instance, for surface mount devices). The leadframe parts such as chip mount pads, lead segments, connecting rails (not shown in FIG. 1, but hinted at by dashed lines) are stamped or etched from the starting metal sheet. As stated, these stamping or etching processes create numerous side edges 110a, 110b . . . 110n, of the leadframe parts.

Figure 2:
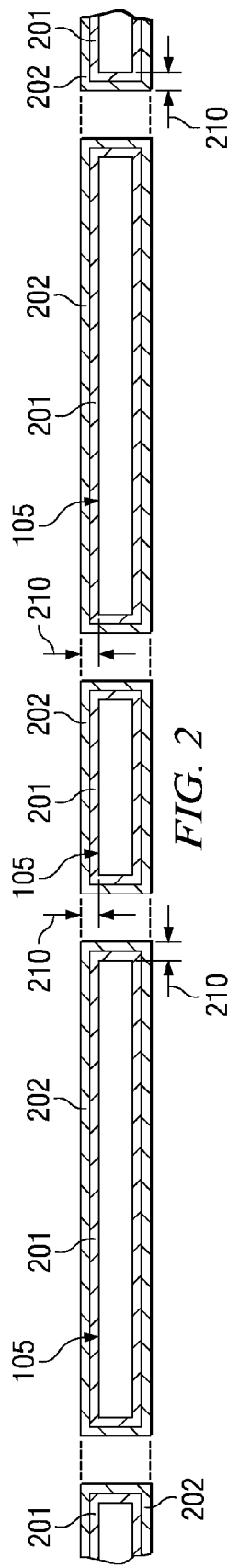
FIG. 2 illustrates a schematic cross section of a leadframe strip portion with a base metal structure and plurality of surfaces, wherein the surfaces have been plated with a stack of adherent layers according to the invention.

FIG. 2 illustrates a schematic cross section of a leadframe strip according to an embodiment of the invention. The leadframe structure has a base metal 105 with a plurality of surfaces, which were created by the process of stamping or etching. The preferred metal for the base is copper or a copper alloy. As stated above, alternatively the base metal is selected from a group consisting of aluminum, an iron-nickel alloy (such as Alloy 42), and Kovar. A layer 210 of noble metal adheres to the base metal surfaces. The noble metal layer 210 includes a layer 201 of gold in contact with the base metal surfaces followed by an outermost layer 202 of palladium in contact with the gold layer. The gold layer 201 has a thickness between about 2 and 5 nm, preferably about 3 nm. The palladium layer has a thickness between about 5 and 15 nm, preferably 10 nm.

Figure 3:
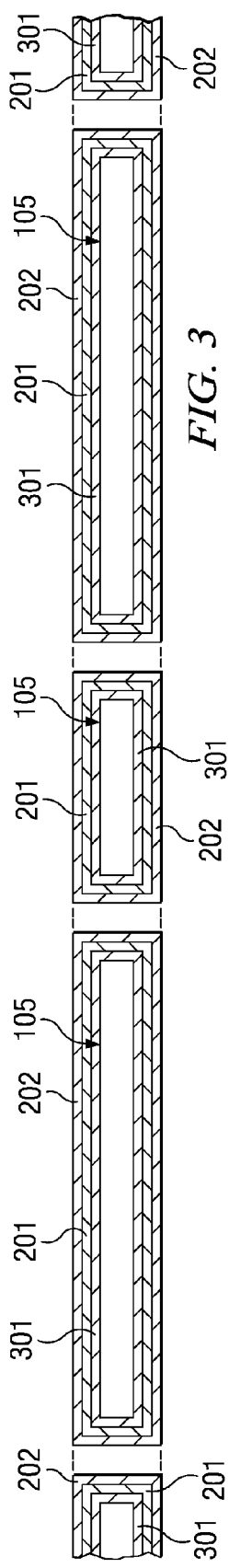
FIG. 3 illustrates a schematic cross section of a leadframe strip portion with a base metal structure and another plurality of surfaces, wherein the surfaces have been plated with a stack of adherent layers according to the invention.

FIG. 3 illustrates a leadframe strip according to another embodiment of the invention. The leadframe structure has a base metal 105 with a plurality of surfaces, which were created by the process of stamping or etching. A stack of metal layers adheres to each of the structure surfaces. The stack consists of a nickel layer 301 in contact with base metal 105, covering substantially the entire base metal surfaces, and a layer of noble metal covering substantially the entire nickel layer. The preferred thickness range of the nickel layer is between about 0.5 and 2.0 µm.

The layer of noble metal is substantially pinhole-free in order to provide an unoxidized nickel surface for uniform and reliable solderability of the finished device, which incorporates the leadframe. The layer of noble metal further needs to provide strong and reliable adhesion to polymerized molding compounds, which are preferably used for device encapsulation. Palladium is the preferred metal for adhesion to plastic encapsulants. However, a palladium layer thickness suitable for reliably providing the desired adhesion may be porous and may display occasional pinholes, unless the palladium layer is backed up by another thin, continuous noble metal layer, preferably gold. The resulting noble metal layer is thus actually composed of two noble metal layers, both thin and, consequently, low cost.

As illustrated in FIG. 3, next to the nickel layer 301 is a gold layer 201 in contact with the nickel layer. The preferred thickness range of the gold layer is between about 2 and 5 nm; the most preferred thickness is about 3 nm. Finally, the outermost layer 202 is a palladium layer in contact with the gold layer. The preferred thickness range of the palladium layer is between about 5 and 15 nm; the most preferred thickness is about 10 nm. In these thickness ranges, the palladium and gold layers offer good bondability, especially for gold bond wires. In addition, the palladium and gold layers offer good solderability.

Since all leadframe surfaces are covered by the stack of metal layers, the preferred layer deposition process is electrolytical plating. The whole leadframe strip is moved through a consecutive array of plating baths (see below) and masking steps can be avoided. Alternatively, electroless plating may be chosen for certain device types, or for post-molding processes.

Figure 4:
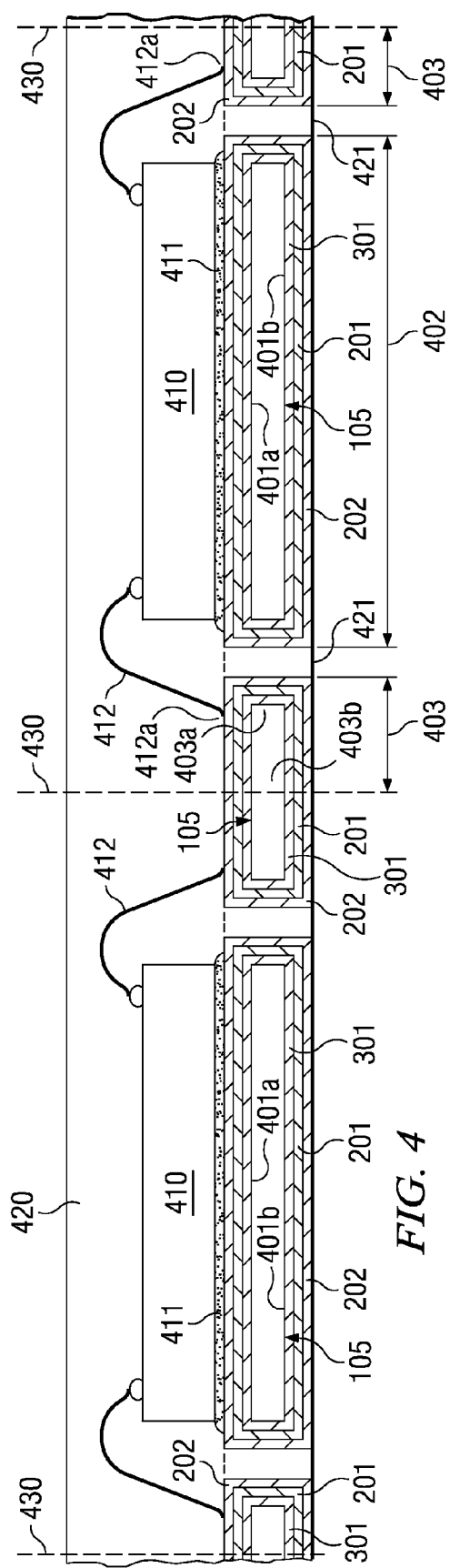
FIG. 4 illustrates a schematic cross section of a device embodiment of the invention, showing a portion of a leadframe strip, prepared according an embodiment of the invention, and a plurality of semiconductor chips assembled and encapsulated on one leadframe surface.

Another embodiment of the invention is a semiconductor device, as exemplified by the Quad Flat No-leads (QFN) or Small Outline No-leads (SON) device in FIG. 4, which shows a leadframe strip with a plurality of assembled and packaged devices before device singulation. In the embodiment of the invention, the device has a leadframe with a structure made from a sheet of base metal 105; the sheet has a first surface 401a and a second surface 401b. A preferred example for the base metal is copper or copper alloy. The leadframe structure in FIG. 4 includes a chip mount pad 402 and a plurality of lead segments 403. Each lead segment has a first end 403a near chip mount pad 402, and a second end 403b remote from mount pad 402.

The first leadframe surface 401a, the second leadframe surface 401b, and all side edges of the structure are covered by a stack of layers, which provides the leadframe with reliable adhesion to polymeric materials and metallurgical affinity to bonding wire metals and reflow metals. In the example shown in FIG. 4, the stack of layers consists of a nickel layer 301 in contact with the base metal 105, and a continuous layer of noble metal in contact with the nickel layer. The noble metal layer includes a gold layer 201 in contact with the nickel layer, and an outermost palladium layer 202 in contact with the gold layer.

A semiconductor chip 410, for example a silicon integrated circuit chip, is attached by means of an adhesive layer 411 to each chip mount pad 402. Conductive connections 412, such as bonding wires made of gold or gold alloy, span from chip 410 to the lead segments 403 and interconnect the chip with the first ends 403a of the lead segments. The stitch bond 412a is pressure bonded to the noble metal layer (palladium layer and gold layer) for reliable stitch attachment.

Polymeric encapsulation material 420, for example epoxy-based molding compound, covers chip 410, bonding wires 412 and the outermost layer 202 on the first leadframe surface 401a of the lead segments. The polymeric material 420 also fills the gaps between chip 410 and the first ends of the lead segments and thus covers the leadframe side edges. In QFN/SON devices, the polymeric compound 420 forms a surface 421 coplanar with (in the same plane as) the outermost palladium layer 202 on the second leadframe surface 401b. Polymeric material 420 leaves the noble metal on the second leadframe surface 401b not covered.

These exposed portions of the second leadframe surface are thus available to be contacted by reflow metals. As an example, tin or a tin alloy may cover at least the portion of the second ends of the lead segments, or alternatively all of the lead segments and the exposed outer chip pad surface. Reflow metals serve to interconnect, mechanically and electrically, the device to an external part such as a circuit board.

Figure 5:
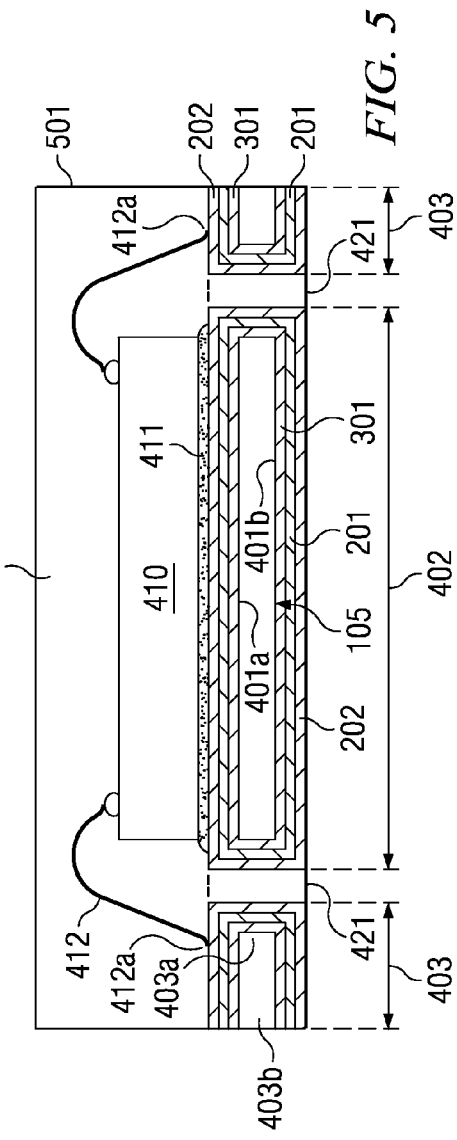
FIG. 5 illustrates a schematic cross section of a singulated device of the QFN/SON type, which includes a leadframe prepared according to the invention.

In FIG. 4, dashed lines 430 indicate the locations, where a saw will cut (singulate) the completed leadframe strip into individual devices of the QFN/SON package type. The saw is cutting through encapsulation material 420 as well as through the leadframe segments. A resulting singulated QFN/SON device with straight sides 501 is illustrated in FIG. 5. In surface mount devices, a standard trim/form step replaces the cutting step with a saw.

Another embodiment of the invention is a method for fabricating a leadframe, which starts with the step of providing a structured base metal strip with a plurality of surfaces, and continues with the steps of plating metal layers on these surfaces. For many device types, electrolytic plating of the leadframe strips is the preferred method. Other device types may require electroless plating. As an example, in order to fabricate the leadframe strip of FIG. 3 for use in the QFN/SON devices of FIGS. 4 and 5, the sequence of the consecutive plating steps is:

Plating a layer of nickel on the base metal in the thickness range from about 0.5 to 2.0 µm.

Plating a layer of gold on the nickel layer in the thickness range from about 2 to 5 nm; preferred thickness is about 3 nm.

Plating a layer of palladium on the gold layer in the thickness range from about 5 to 15 nm; preferred thickness is about 10 nm.

Electrolytic plating allows consecutive reel-to-reel processing and is, therefore, inexpensive and suitable for high throughput. Electroless plating is suitable for post-mold plating and can also be arranged as a high throughput technique.

While this invention has been described in reference to illustrative embodiments, this description is not intended to be construed in a limiting sense. Various modifications and combinations of the illustrative embodiments, as well as other embodiments of the invention, will be apparent to persons skilled in the art upon reference to the description. As an example, the invention applies to products using any type of semiconductor chip, discrete or integrated circuit, and the material of the semiconductor chip may comprise silicon, silicon germanium, gallium arsenide, or any other semiconductor or compound material used in integrated circuit manufacturing.

As another example, the invention applies to many semiconductor device types other than the example of an QFN/SON devices described, for instance surface mount devices, small outline devices, and leaded devices.

As another example, the process step of stamping the leadframes from a sheet of base metal may be followed by a process step of selective etching, especially of the exposed base metal surfaces in order to create large-area contoured surfaces for improved adhesion to molding compounds. The sequence of plated layers according to the invention can accommodate any such specially etched leadframe base structures.

It is therefore intended that the appended claims encompass any such modifications or embodiment.

I claim:

1. A method for fabricating a leadframe comprising the steps of:
   providing a leadframe structure having a base metal strip with a plurality of surfaces;
   plating a gold layer to cover all the surfaces of the base metal strip; and
   plating an outer layer of palladium to cover and to contact the gold layer, wherein the leadframe structure comprises chip mount pads and lead segments.

2. The method according to claim 1 further comprising the step of plating a nickel layer on the base metal surfaces before the step of plating the gold layer, whereby the nickel layer is in contact with the base metal surfaces and with the gold layer.

3. The method according to claims 1, wherein the steps of plating are electrolytic plating.

4. The method according to claims 1, wherein the steps of plating are electroless plating.

5. The method according to claim 1 wherein the gold layer has a thickness between about 2 and 5 nm.

6. The method according to claim 1 wherein the gold layer is about 3 nm thick.

7. The method according to claim 1 wherein the palladium layer has a thickness between about 5 and 15 nm.

8. The method according to claim 1 wherein the palladium layer is about 10 nm thick.

9. The method according to claim 1 wherein the nickel layer has a thickness between about 0.5 and 2.0 µm.

\* \* \* \* \*